United States Patent
Chang et al.

(10) Patent No.: US 10,840,381 B2
(45) Date of Patent: Nov. 17, 2020

(54) NANOSHEET AND NANOWIRE MOSFET WITH SHARP SOURCE/DRAIN JUNCTION

(71) Applicant: INTERNATIONAL BUSINESS MACHINES CORPORATION, Armonk, NY (US)

(72) Inventors: Josephine B. Chang, Bedford Hills, NY (US); Kangguo Cheng, Schenectady, NY (US); Michael A. Guillorn, Cold Springs, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 502 days.

(21) Appl. No.: 15/233,386

(22) Filed: Aug. 10, 2016

(65) Prior Publication Data
US 2018/0047853 A1 Feb. 15, 2018

(51) Int. Cl.
| | |
|---|---|
| *H01L 21/225* | (2006.01) |
| *H01L 29/786* | (2006.01) |
| *H01L 29/423* | (2006.01) |
| *H01L 29/66* | (2006.01) |
| *H01L 29/06* | (2006.01) |

(52) U.S. Cl.
CPC .... *H01L 29/78696* (2013.01); *H01L 21/2255* (2013.01); *H01L 29/0673* (2013.01); *H01L 29/42392* (2013.01); *H01L 29/66439* (2013.01); *H01L 29/66545* (2013.01)

(58) Field of Classification Search
CPC ......... H01L 29/78696; H01L 29/66439; H01L 29/42392; H01L 29/0673; H01L 29/775; H01L 29/66545; H01L 29/66795–66818; H01L 29/785–792; H01L 21/823431; H01L 21/823821; H01L 27/0886; H01L 27/823481; H01L 21/02603; H01L 21/3086; H01L 21/31111; H01L 21/2255; H01L 21/2256
See application file for complete search history.

(56) References Cited

U.S. PATENT DOCUMENTS

| | | | |
|---|---|---|---|
| 5,696,016 A | 12/1997 | Chen et al. | |
| 6,248,650 B1 * | 6/2001 | Johnson | ............ H01L 29/66272 257/E21.375 |

(Continued)

FOREIGN PATENT DOCUMENTS

| | | |
|---|---|---|
| KR | 100227874 B1 | 8/1999 |
| KR | 100399949 B1 | 9/2003 |

(Continued)

*Primary Examiner* — Eric A. Ward
*Assistant Examiner* — Eric K Ashbahian
(74) *Attorney, Agent, or Firm* — Tutunjian & Bitetto, P.C.; Daniel Morris

(57) ABSTRACT

A semiconductor device that includes a gate structure present on at least two suspended channel structures, and a composite spacer present on sidewalls of the gate structure. The composite spacer includes a cladding spacer present along a cap portion of the gate structure, and an inner spacer along the channel portion of the gate structure between adjacent channel semiconductor layers of at least two suspended channel structures. The inner spacer may be composed of an n-type or p-type doped glass.

17 Claims, 7 Drawing Sheets

(56) References Cited

U.S. PATENT DOCUMENTS

| | | | |
|---|---|---|---|
| 8,440,552 B1* | 5/2013 | Chen | H01L 29/66545 |
| | | | 438/563 |
| 8,691,650 B2 | 4/2014 | Cheng et al. | |
| 8,753,942 B2 | 6/2014 | Kuhn et al. | |
| 9,041,108 B2 | 5/2015 | Cheng et al. | |
| 9,053,946 B2 | 6/2015 | Cheng et al. | |
| 9,059,005 B2 | 6/2015 | Cheng et al. | |
| 9,647,139 B2* | 5/2017 | Doris | H01L 21/0228 |
| 2007/0034973 A1* | 2/2007 | Yun | H01L 29/42392 |
| | | | 257/408 |
| 2012/0190216 A1* | 7/2012 | Chan | H01L 21/823412 |
| | | | 438/799 |
| 2012/0305893 A1* | 12/2012 | Colinge | H01L 29/66795 |
| | | | 257/29 |
| 2014/0001441 A1 | 1/2014 | Kim et al. | |
| 2014/0353735 A1* | 12/2014 | Basker | H01L 21/823431 |
| | | | 257/288 |
| 2017/0256609 A1* | 9/2017 | Bhuwalka | H01L 29/0665 |
| 2017/0271477 A1* | 9/2017 | Palle | H01L 29/66553 |

FOREIGN PATENT DOCUMENTS

| | | |
|---|---|---|
| KR | 100425063 B1 | 3/2004 |
| TW | 442919 B | 6/2001 |

* cited by examiner

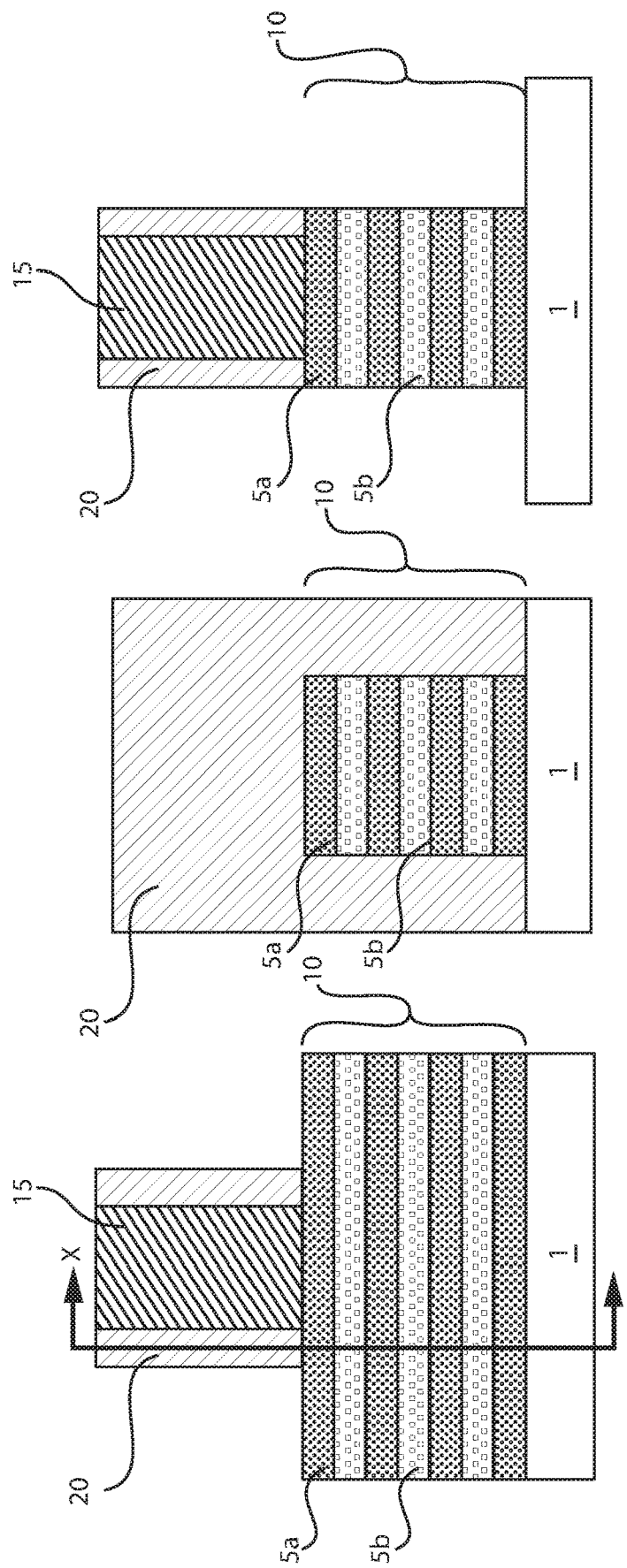

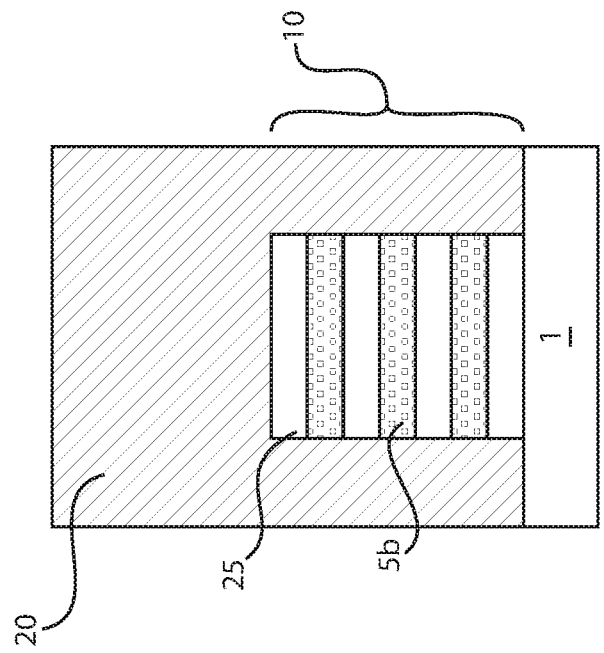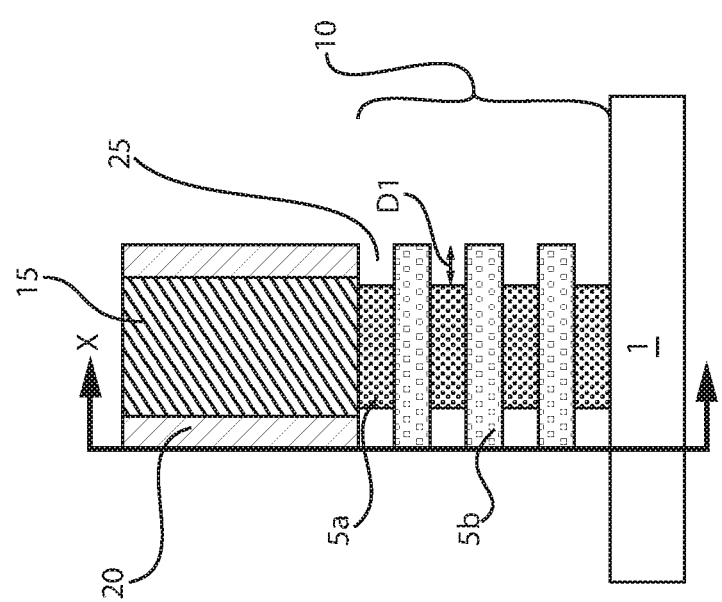

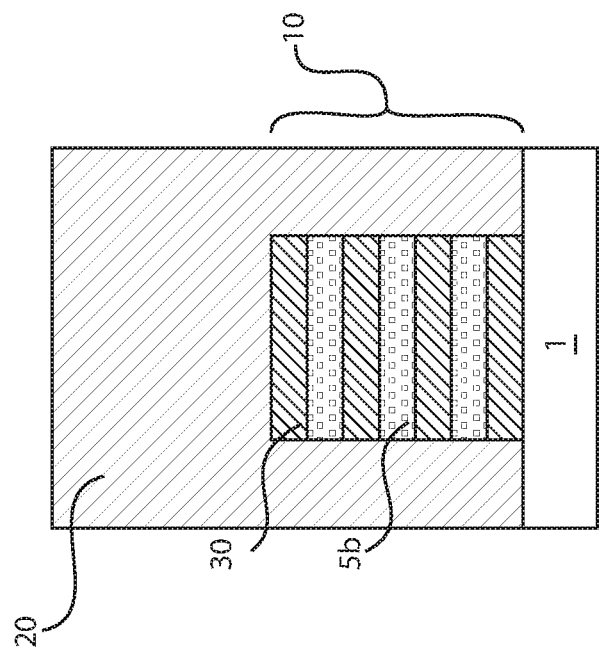
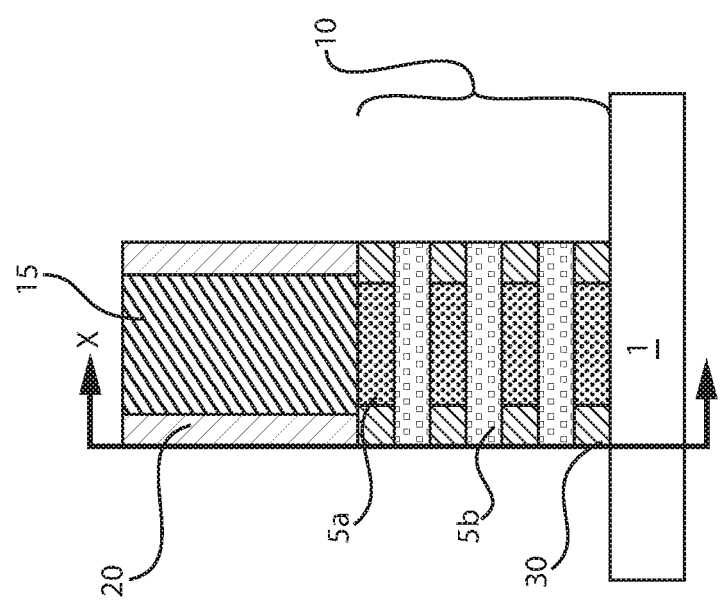

US 10,840,381 B2

NANOSHEET AND NANOWIRE MOSFET WITH SHARP SOURCE/DRAIN JUNCTION

BACKGROUND

Technical Field

The present disclosure relates to semiconductor devices, and more particularly to semiconductor devices including channel regions integrated within nanowires and nano-sheets.

Description of the Related Art

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

In one aspect, the present disclosure provides a suspended channel field effect transistor (FET). The suspended channel field effect transistor may include a gate structure present on at least two suspended channel structures; and a composite spacer present on sidewalls of the gate structure. The composite spacer may include a cladding spacer present along a cap portion of the gate structure, and an inner spacer along the channel portion of the gate structure between adjacent channel semiconductor layers of said at least two suspended channel structures. The inner spacer may include an n-type or p-type doped glass.

In another aspect, a method of forming a suspended channel field effect transistor (FET) is provided that includes forming a gate structure on a stack of at least two semiconductor materials, wherein a spacer is present on sidewalls of the gate structure, and etching exposed portions of the stack of at least two semiconductor materials with an etch process. In some embodiments, the etch process includes a stage that removes one of the at least two semiconductor materials at a faster rate than a second of the at least two semiconductor materials to provide a divot region undercutting the spacer. An n-type or p-type doped glass is formed that fills the divot region. Epitaxial semiconductor material is formed on remaining semiconductor material from said stack of at least two semiconductor materials.

In another embodiment, the present disclosure provides a method of forming a semiconductor device that may include forming a replacement gate structure on a channel portion of a stack of at least two semiconductor materials. A cladding spacer may be formed on sidewalls of the replacement gate structure. A first etch process is applied to remove one of the at least two semiconductor materials to provide a divot region undercutting the spacer. An n-type or p-type doped glass layer is formed on sidewalls of the channel opening, wherein the n-type or p-type doped glass layer fills the divot. The replacement gate structure may be removed to provide a gate opening that exposes a channel portion of the stack of the two semiconductor materials. A second etch process is applied to remove one of the at least two semiconductor materials the channel portion of the at least two semiconductor materials to provide a plurality of suspended channels. A functional gate structure is formed in the channel opening.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 2A is a side cross-sectional view along the source to drain direction of FIG. 1.

FIG. 2B is a side cross-sectional view through the spacer of FIG. 2A.

FIG. 3 is a side cross-sectional view along the side cross-section of the fin structure stack along the source to drain direction illustrating one embodiment of removing exposed portions of the fin structure stack that extend beyond the outer sidewall of the cladding spacer.

FIG. 4A is a side cross-sectional view along the side cross-section of the fin structure stack along the source to drain direction illustrating one embodiment of applying a first etch process to remove one of the at least two semiconductor materials of the fin structure stack to form a divot regions undercutting the cladding spacer, in accordance with one embodiment of the present disclosure.

FIG. 4B is a cross-sectional view through the spacer illustrating the formation of a void, i.e., divot region, which is undercutting the cladding spacer.

FIG. 5A is a side cross-sectional view along the side cross-section of the fin structure stack along the source to drain direction depicting forming an n-type or p-type doped glass layer on etched sidewalls of the fin structure stack to fill the divot regions, in accordance with one embodiment of the present disclosure.

FIG. 5B is a cross-sectional view through the spacer illustrating the void, i.e., divot region, that is undercutting the cladding spacer being filled with the n-type or p-type doped glass layer.

DETAILED DESCRIPTION

Figure 1:
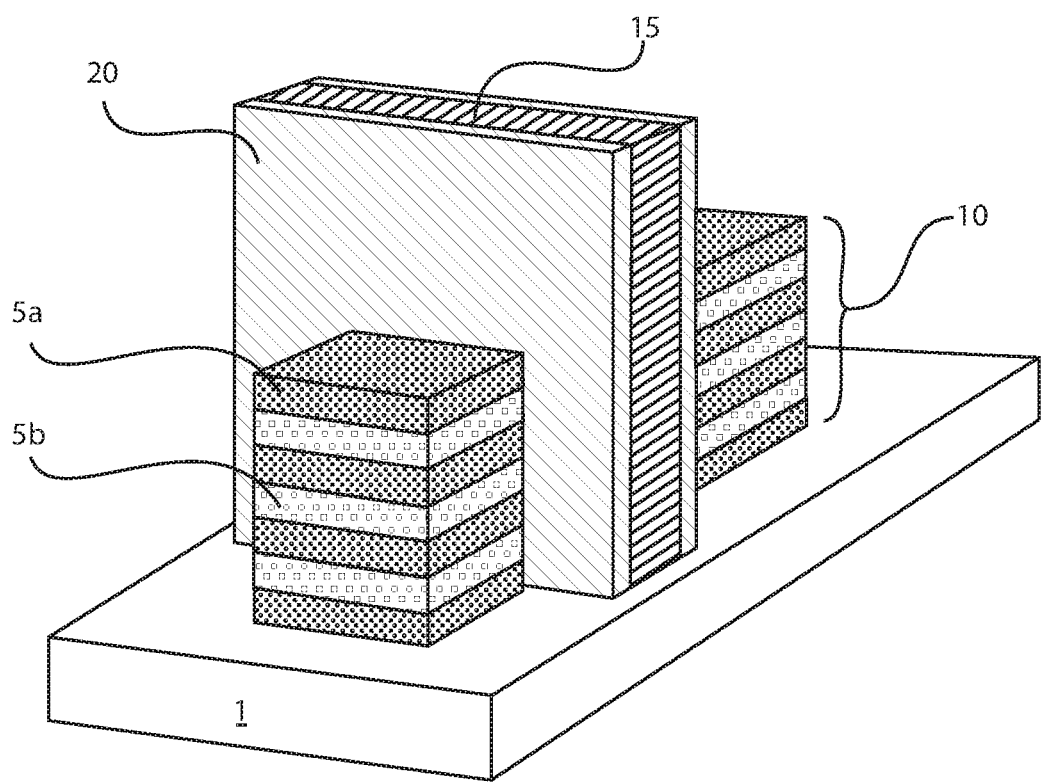
FIG. 1 is a perspective view depicting one embodiment of forming a replacement gate structure on a fin structure stack of at least two semiconductor materials, wherein a cladding spacer is present on sidewalls of the replacement gate structure, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe a nanowire and nanosheet transistors. Nanosheet (nanowire) MOSFET is a candidate for future CMOS technology. Nanowire and/or nanowire MOSFETs can provide better gate electrostatic control and larger effective device width per footprint (multiple nanosheets in one stack). In some embodiments, an inner spacer between nanosheets can reduce the parasitic capacitance between a gate to the nanosheets and the source/drain region. In order to reduce Ron, i.e., the one-state source to drain resistance of a MOSFET, the nanosheets typically have high doping at the spacer region, e.g., $5 \times 10^{18}$ dopants/cm$^3$ to $1 \times 10^{19}$ dopants/cm$^3$. It has been determined that typically such doping at the spacer region is achieved by aggressive dopant diffusion from the doped source/drain into the spacer region. It has further been determined that remote doping into the spacer region results in high doping of the channel region, which degrades the channel mobility and short-channel control. In some embodiments, the methods and structures disclosed herein provide a nanosheet metal oxide semiconductor field effect transistor (MOSFET) structure with an inner spacer composed of boron/phosphorus doped glass, e.g., boron doped silicate glass or phosphorus doped silicate glass, which helps to provide a high dopant concentration in the spacer region, without introducing too many dopants in the channel region. In some embodiments, the inner spacer that is composed boron/phosphorus doped glass, e.g., boron doped silicate glass or phosphorus doped silicate glass, facilitates the formation of an abrupt junction, i.e., sharp source/drain junction (sharp S/D junction). Further details regarding the method and structures of the present disclosure are now described with reference to FIGS. 1-10.

FIG. 1 depicts one embodiment of forming a first replacement gate structure 15 on a stack 10 of at least two semiconductor materials 5a, 5b that can be etched selectively to one another, wherein a cladding spacer 20 is present on sidewalls of the gate structure 15. The stack 10 of the at least two semiconductor materials 5a, 5b may be present on a substrate 1. The substrate 1 may be composed of a supporting material, such as a semiconductor material, e.g., silicon, or dielectric material, such as silicon oxide or silicon nitride.

The stack 10 of the at least two semiconductor materials 5a, 5b is typically composed of two alternating materials. For example, the first semiconductor material 5a that is present on the substrate 1 may be composed of a silicon and germanium containing semiconductor material, such as silicon germanium (SiGe), whereas the second semiconductor material 5b that is present on the first semiconductor material 5b may be composed of a germanium free silicon containing semiconductor material, such as silicon (Si). It is noted that this is only one example of semiconductor materials that may be used for the at least two semiconductor materials 5a, 5b. Any semiconductor material composition may be used for each of the at least two semiconductor materials 5a, 5b so long as at least one of the compositions selected allow for selective etching between at least two of them. Any type IV semiconductor composition combination and/or III-V semiconductor composition combination is suitable for use with the present disclosure. For example, the compositions selected for the at least two semiconductor materials include Si, SiGe, SiGeC, SiC, single crystal Si, polysilicon, i.e., polySi, epitaxial silicon, i.e., epi-Si, amorphous Si, i.e., α:Si, germanium, gallium arsenide, gallium nitride, cadmium telluride and zinc sellenide.

Although FIG. 1 only depicts two semiconductor material layers in the stack 10 of the at least two semiconductor materials 5a, 5b, it is noted that the present disclosure is not limited to only this example. Any number of semiconductor material layers 5a, 5b may be present in the stack 10. For example, the number of semiconductor material layers 5a, 5b in the stack may also be equal to 3, 4, 5, 10, 15 and 20, as well as any value between the aforementioned examples. In one embodiment, the first semiconductor material 5a is silicon germanium (SiGe), and the second semiconductor material 5b is silicon (Si).

The stack 10 of the at least two semiconductor materials 5a, 5b may be formed using a deposition process, such as chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes suitable for use the present disclosure include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The thickness of each of the at least two semiconductor material layers 5a, 5b, may range from 1 nm to 30 nm. In another embodiment, the thickness of each of the at least two semiconductor material layers 5a, 5b, may range from 5 nm to 20 nm.

Following deposition, the semiconductor material layers 5a, 5b may be patterned to provide the geometry of the stack. In some embodiments, the semiconductor material layers 5a, 5b may be patterned using deposition, photolithography and subtractive etch processing. In one example, the stack 10 may have a height $H_1$ ranging from 5 nm to 200 nm, and a width ranging from 5 nm to 60 nm.

The stack of the semiconductor material layers 5a, 5b may be referred to as a fin stack.

Still referring to FIG. 1, the process flow may continue with forming a first replacement gate structure 15 on a channel portion of the stack 10 of the at least two semiconductor materials 5a, 5b. By "replacement" it is meant that the structure is present during processing of the semiconductor device, but is removed from the semiconductor device prior to the device being completed. In the present process flow, a replacement gate structure 15 is employed as part of a replacement gate process. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the replacement gate structure 15 may be composed of any material that can be etched selectively to the at least one of the material layers of the stack 10 of the at least two semiconductor materials 5a, 5b. In one embodiment, the replacement gate structure 15 may be composed of a silicon-including material, such as polysilicon. In another embodiment, the replacement gate structure 15 may be composed of a dielectric material, such as an oxide, nitride or oxynitride material, or amorphous carbon. The replacement gate structure 15 may be formed using deposition (e.g., chemical vapor deposition) photolithography and etch processes (e.g., reactive ion etching).

Still referring to FIG. 1, a cladding spacer 20 is formed on the sidewall of the replacement gate structure 15. The cladding spacer 20 is typically composed of a dielectric material, such as an oxide, nitride, or oxynitride material. In one example, when the spacer 20 is composed of a nitride, the cladding spacer 20 may be composed of silicon nitride, and when the spacer 20 is composed of oxide, the cladding spacer 20 may be composed of silicon oxide. In another example, the cladding spacer 20 may be composed of a low-k dielectric. In some examples, the low-k dielectric of the cladding spacer 20 may have a dielectric constant of 4.0 or less (measured at room temperature, e.g., 25° C., and 1 atm). For example, a low-k dielectric material suitable for the spacer 20 may have a dielectric constant ranging from about 1.0 to about 3.0. Examples of low-k materials suitable for the cladding spacer 20 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ)), and combinations thereof.

The cladding spacer 20 may be formed using a deposition process, such as chemical vapor deposition (CVD), and an anisotropic etchback method. The cladding spacer 20 may be present on the sidewalls of the replacement gate structure 15, and may have a thickness T1 ranging from 1 nm to 15 nm.

FIG. 2A is a side cross-sectional view along section line A-A of FIG. 1. This cross-section when referring to the figures disclosed herein, i.e., FIGS. 3, 4A, 5A, 6, 7, 8A, 9 and 10, is hereafter referred to as a side cross-section of a fin structure stack 10 along source to drain direction. FIG. 2B is a side cross-sectional view along section line B-B of the structure depicted in FIG. 1. This cross-section when referring to the figure disclosed herein, i.e., FIGS. 4B, 5B and 8B, is hereafter referred to as through the spacer, i.e., cladding spacer 20.

FIG. 3 depicts etching the exposed portions of the stack 10 of two semiconductor materials 5a, 5b that extend beyond the outer sidewall of the cladding spacer 20. In some embodiments, the etch process for removing the exposed portions of the stack 10 of the at least two semiconductor materials 5a, 5b is an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiments, the etch process for etching the stack 10 is a timed etch. In the embodiment that is depicted in FIG. 3, the etch process may continue until the entirety of the portions of the stack 10 that extend beyond the outer sidewall of the cladding spacer 20 are removed.

In some embodiments, the etch process for removing the portion of the stack 10 that extends beyond the outer sidewall of the spacer 20 may be a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, the etch process may remove the exposed silicon and germanium containing material of the first semiconductor layer 5a, e.g., silicon germanium (SiGe), and the exposed silicon material that is free of germanium in the second semiconductor layer 5b, selectively to at least one of the silicon nitride material of the spacer 20, the replacement gate structure 15 and the substrate 1. In some embodiments, an etch block mask, such as a photoresist or hardmask, e.g., silicon nitride mask, may be formed over the replacement gate structure 15 during the etch process for removing the exposed portions of the stack 10 of the at least first and second semiconductor material 5a, 5b.

FIGS. 4A and 4B depict applying an etch process to remove one of the at least two semiconductor materials 5a, 5b of the fin structure stack 10 to form a divot regions 25 undercutting the cladding spacer 20. FIG. 4B illustrates the formation of a void, i.e., divot region 25, that is undercutting the cladding spacer 20. In some embodiments, the etch process for forming the divot 25 is isotropic. By isotropic it is meant that the etch process is non-directional. The etch for forming the divot 25 may be referred to as an undercut etch or a lateral etch. In one embodiment, an isotropic etch, such as a plasma etch or wet chemical etch, may remove a portion of one of the first and second semiconductor layers 5a, 5b of the stack 10 selectively to at least one of the other semiconductor material layers of the stack 10. For example, when the first semiconductor material layer 5a of the stack 10 is composed of silicon germanium (SiGe), and the second semiconductor layer 5b of the stack 10 is composed of silicon (Si), the etch chemistry of the second stage of the first etch process may be selected to remove silicon germanium without substantially etching the silicon. The isotropic nature of the etch process produces a divot region 35 in underlying the cladding spacer 20 by removing the first semiconductor layer 5a etching inward from the exposed sidewall of the stack 10 that is substantially aligned with the outside sidewall of the cladding spacer 20 selectively to the second semiconductor layer 5b. It is noted that removing the first semiconductor layer 5a selectively to the second semiconductor layer 5b is only one example of the present disclosure, and the etch selectivity with respect to the first and second semiconductor layers 5a, 5b and the isotropic etch may be reversed. The second etch stage, i.e., isotropic etch, may be continued until a divot region 25 is formed undercutting the spacer 20 that has a dimension D1 ranging from 1 nm to 20 nm. In another embodiment, the lateral etch step may be continued until a divot region 25 is formed undercutting the spacer 20 that has a dimension D1 ranging from 1 nm to 10 nm.

FIG. 4B illustrates the void that provides the divot region 25.

FIGS. 5A and 5B depicts forming an n-type or p-type doped glass layer 30 on etched sidewalls of the fin structure stack to fill the divot regions 25. FIG. 5B is a cross-sectional view through the cladding spacer 20 illustrating the void, i.e., divot region 25, that is undercutting the cladding spacer 20 being filled with the n-type or p-type doped glass layer 30. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

In one example of the embodiment that is depicted in FIGS. 5A and 5B, the n-type or p-type doped glass layer 30 may be silicate glass doped with a p-type dopant, such as boron. In one example, the p-type doped glass layer may include boron doped silicate glass (BSG). It is noted that the above example is provided for illustrative purposes only and is not intended to limit the present disclosure, as other p-type dopants may be integrated into the p-type doped glass. In other examples, the n-type or p-type doped glass layer 30 may be doped with an n-type dopant, such as arsenic. In one example, the n-type doped glass layer 30 may include phosphosilicate glass (PSG) (n-type silicate glass) and arsenosilicate glass (ASG) (n-type silicate glass). It is noted that the above example is provided for illustrative purposes only and is not intended to limit the present disclosure, as other n-type dopants and/or p-type dopants may be integrated into the n-type or p-type doped glass layer 30.

The n-type or p-type doped glass layer 30 may be deposited by atomic layer deposition (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a deposition surface by exposing the surface to alternate gaseous species (typically referred to as precursors). In contrast to chemical vapor deposition, the precursors are never present simultaneously in the reactor, but they are inserted as a series of sequential, non-overlapping pulses. In each of these pulses, the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

The atomic layer deposition (ALD) process may be continued until at least the entirety of the divot regions 25 are filled. For example, the ALD process may continue until the entirety of the divot regions 25 are filled, in which a portion of the deposited layer of the n-type or p-type doped glass extends onto the exposed sidewall portions of the stack 10 outside the divot region 25.

The n-type or p-type doped glass layer 30 may be deposited using chemical vapor deposition (CVD), such as plasma enhanced CVD (PECVD) or metal organic chemical vapor deposition (MOCVD). The n-type or p-type doped glass layer 30 may also be formed using chemical solution deposition or spin on deposition, e.g., spin on glass deposition. The dopant may be introduced to the doped glass layer in-situ. By "in-situ" it is meant that the dopant e.g., n-type or p-type, that is being introduced to the n-type or p-type doped glass layer 30 is introduced during the deposition step that forms the n-type or p-type doped glass layer 30. In some embodiments, the thickness of the n-type or p-type doped glass layer 30 may range from 2 nm to 50 nm. In other embodiments, the thickness of the n-type or p-type doped glass layer 30 ranges from 5 nm to 25 nm.

FIGS. 5A and 5B depict a second etch process that removes any portion of the n-type or p-type doped glass layer 30 that is extending from the divot 25 and exposes sidewalls of the remaining portion of the stack 10. The second etch process may include an isotropic etch, such as a plasma etch or wet chemical etch, that removes the atomic layer (ALD) deposited n-type or p-type doped glass layer 30 from the sidewalls of the stack 10, as well as any portion of the n-type or p-type doped glass layer 30 that extends onto the upper surface of the first replacement gate structure 15, the cladding spacer 20 and the upper surface of the substrate 1. The second etch may form a curvature in the atomic layer deposited (ALD) n-type or p-type doped glass layer 30 that is present in the divot region 25. The curvature undercuts the outside sidewall of the spacer 20 with the apex of the curvature within the divot region 25.

FIG. 5B illustrates the void of the divot region 25 being filled with the material of the n-type or p-type doped glass layer 30.

Figure 6:
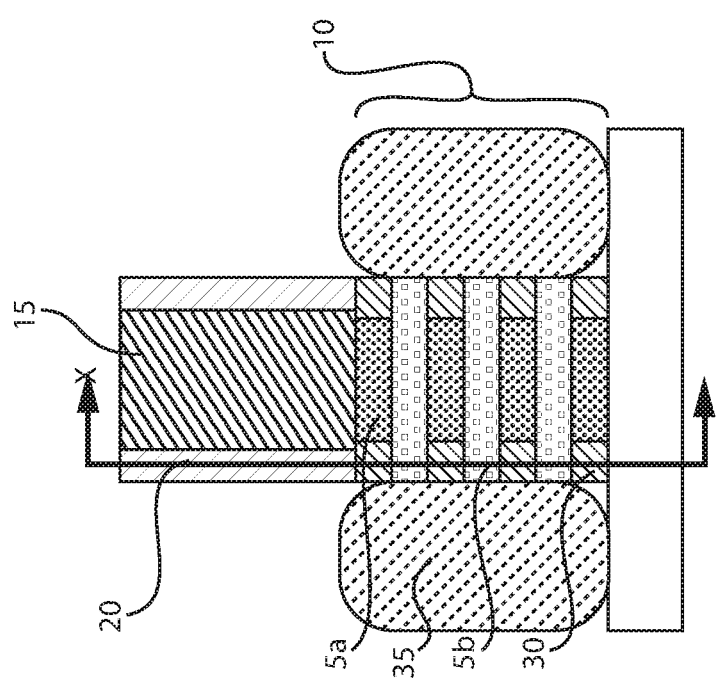
FIG. 6 is a side cross-sectional view along the side cross-section of the fin structure stack along the source to drain direction depicting forming epitaxial semiconductor material on source and drain portions of the stack of the at least two semiconductor materials.

FIG. 6 depicts one embodiment of forming epitaxial semiconductor material 35 on the exposed sidewalls of the remaining portion of the stack 10 of the two semiconductor materials 5a, 5b. The epitaxial semiconductor material 35 may provide at least a portion of the source and drain regions of the semiconductor device. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The epitaxial semiconductor material 35 grows from the etched sidewall surface of the second semiconductor layer 5b. In some embodiments, the epitaxial semiconductor material 35 may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs). In one embodiment, a number of different sources may be used for the epitaxial deposition of the epitaxial semiconductor material 35. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material 6a, 6b of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material 35 may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material 35 is doped with a p-type dopant to have a p-type conductivity. In a type IV semiconductor, such as silicon, examples of p-type dopants, i.e., impurities, include but are not limited to, boron, aluminum, gallium and indium. In a type IV semiconductor, such as silicon, examples of n-type dopants, i.e., impurities, include but are not limited to antimony, arsenic and phosphorous.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine ($(CH_3)_3P$), dimethylphosphine ($(CH_3)_2PH$), triethylphosphine ($(CH_3CH_2)_3P$) and diethylphosphine ($(CH_3CH_2)_2PH$). The p-type gas dopant source may include diborane ($B_2H_6$).

The conductivity type of the epitaxial semiconductor region 35, i.e., whether the epitaxial semiconductor region 35 has an n-type or p-type conductivity, is typically the same as the conductivity type of the n-type or p-type glass layer 30 that is present within the divot region 25. The dopant for the epitaxial semiconductor material 35 that dictates the conductivity type of the source and drain regions is typically present in a concentration ranging from 1E17 atoms/$cm^3$ to 5E19 atoms/$cm^3$.

Figure 7:
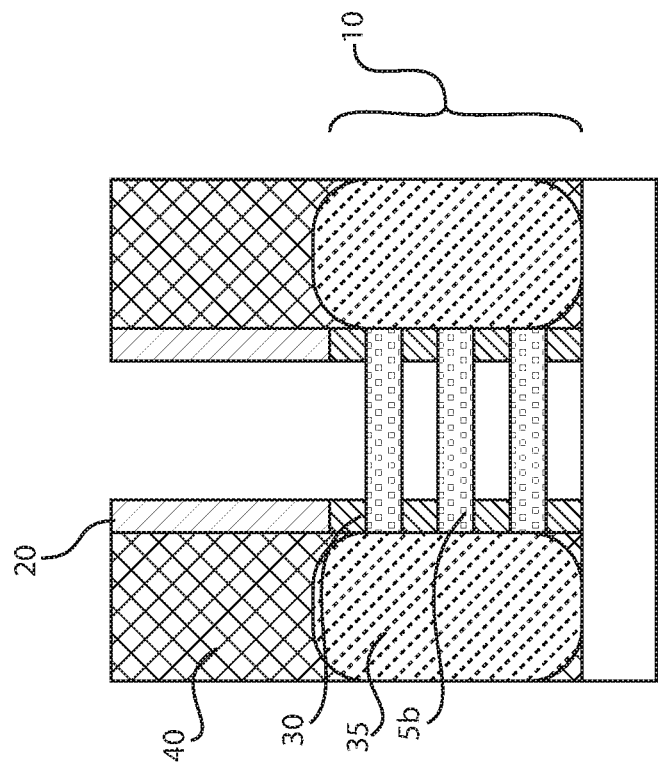
FIG. 7 is a side cross-sectional view of the fin structure stack along the source to drain direction depicting one embodiment of removing the replacement gate structure to provide a gate opening, and applying a second etch process to remove one of the at least two semiconductor materials from the channel portion of the at least two semiconductor materials to provide a plurality of suspended channels, in accordance with one embodiment of the present disclosure.
Figure 8B:
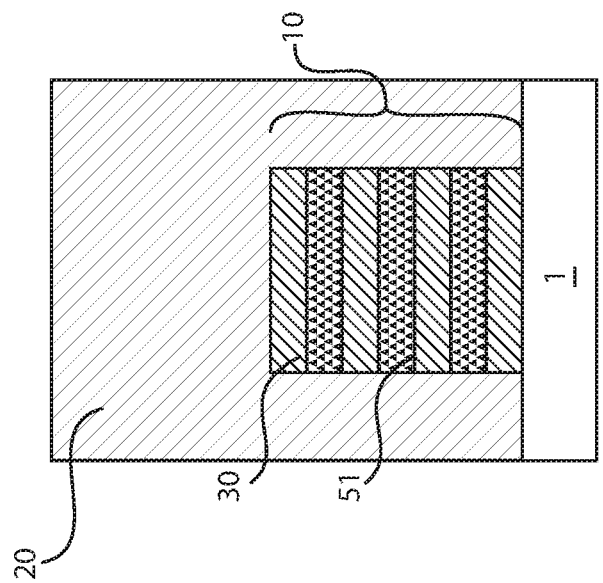
FIG. 8B is a cross-sectional view through the spacer illustrating the portions of the suspended channel underlying the cladding spacer being doped with the n-type or p-type dopant that has been driven from the n-type or p-type doped glass by the drive in anneal.

FIG. 7 depicts removing a first replacement gate structure 15 and removing one of the two semiconductor materials, e.g., the first semiconductor material layer 5a, of the stack in a channel region of the device. In some embodiments, removing the replacement gate structure 15 may begin with forming an interlevel dielectric layer 40 on the structure depicted in FIG. 6, and planarizing the interlevel dielectric layer 40 to expose an upper surface of the replacement gate structure 15. The replacement gate structure 15 may be removed using a wet or dry etch process. In one embodiment, the first replacement gate structure 15 may be removed by at least one of an anisotropic etch process, such as reactive ion etch (RIE), or an isotropic etch process, such as a wet chemical etch. In one example, the etch process for removing the first replacement gate structure 15 can include an etch chemistry for removing the first replacement gate structure 15 is selective to the material layers of the stack 10 of the first and second semiconductor material layers 5a, 5b.

Following removing the first replacement gate structure 15, at least one of the material layers of the stack 10 is removed selectively to at least a remaining material composition that provides suspended channel structures 50. For example, in one embodiment when the first semiconductor material layer 5a is composed of silicon germanium (SiGe) and the second semiconductor material layer 5b is composed of silicon, the first semiconductor material layer 5a may be removed selectively to the second semiconductor material layer 5b with an etch process, such as a wet chemical etch. Removing the replacement gate structure 15 produces a gate opening 45 that exposes a channel portion of the stack 10 of the two semiconductor materials 5a, 5b.

In this example, following removal of one of the material layers of the stack 10, e.g., removal of the first semiconductor material layer 5a of the stack 10, a suspended channel structure 50 is provided. By "suspended channel" it is meant that at least one semiconductor material layer is present overlying the substrate 1, wherein the sidewalls of the suspended channel 50 are supported, e.g., anchored, in the spacer 20 and the n-type or p-type doped glass 30 that is present in the divot region 25. Gate structure materials, electrically conductive materials and/or semiconductor materials may be formed in the space surrounding the suspended structures.

Although FIG. 7 depicts three suspended channel structures 50, the present disclosure is not limited to only this embodiment. Any number of suspended channel structures 50, such as suspended nanowires and/or nanosheets, may be formed using the methods and structures provided by the present disclosure.

In some embodiments, the suspended channel structures 50 may be further processed to provide a nanosheet or nanowire geometry. The term "nanosheet" denotes a substantially two dimensional structure with thickness in a scale ranging from 1 to 100 nm. The width and length dimensions of the nanosheet may be greater than the width dimensions. As used herein, the term "nanowire" describes a structure having a cross-section with a perimeter defined by a curvature, wherein a diameter of the cross-section is less than 1 micron. A nanowire may have an aspect ratio, e.g., height to width ratio, that is approximately 1. In some examples, the cross-section of the nanowire may have a diameter ranging from 1 nm to 40 nm.

The suspended channel structures 50 may be nanosheets. In some embodiments, the suspended channel structures 50 are further processed to provide nanowires. For example, a nanowire geometry can be produced from the suspended channel structures 50 using etch processing, such as isotropic etch processing. The nanowires may be multi-sided in cross section or may have an elliptical or cylindrical shape. In some embodiments, in which the suspended channel structures 50 are multi-sided cross section, e.g., square or rectangular cross section, and the suspended channel structures 50 are further processed to provide nanowires having an elliptical or cylindrical shape, the suspended channel structures may be smoothed 40 to form an elliptical shaped or cylindrical shaped nanowire using a hydrogen anneal. The portions of the suspended channel structures 50 that are underlying the cladding spacer 20 are protected from being smoothed by the hydrogen anneal. In some embodiments, the hydrogen anneal that is employed in the present disclosure can be performed at a temperature from 600° C. to 1000° C. The pressure of hydrogen used during the hydrogen anneal can range from 5 torr to 600 torr.

Figure 8A:
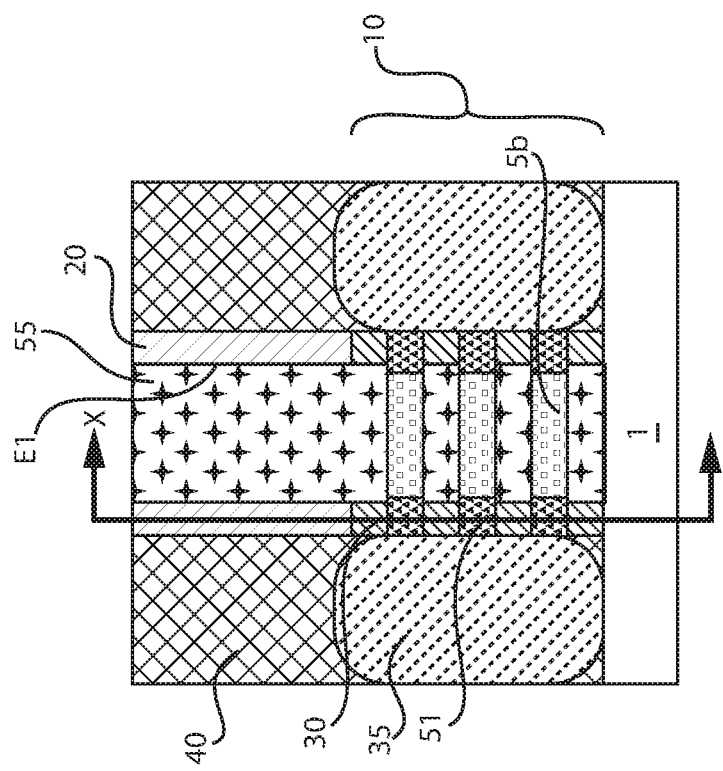
FIG. 8A is a side cross-sectional view of the fin structure stack along the source to drain direction of forming a second replacement gate structure in the gate opening, and applying a drive in anneal to drive dopants from the n-type or p-type doped glass into the junction with the suspended channels.

In a following process step, a second replacement gate structure 55, i.e., a gate structure composed of a sacrificial material, is formed in the gate opening 45, as depicted in FIGS. 8A and 8B. The sacrificial material of the second replacement gate structure may be a semiconductor material, such as amorphous silicon. The material for the second replacement gate structure 55 may be deposited using chemical vapor deposition, such as plasma enhanced chemical vapor deposition (PECVD). It is noted that the above examples are provided for illustrative purposes only. Other sacrificial materials are also suitable for use with the present disclosure including dielectrics and metals. The sacrificial material for the second replacement gate structure may also be deposited using spin on deposition or chemical solution deposition.

FIGS. 8A and 8B depict applying a drive in anneal to drive dopants from the n-type or p-type doped glass 30 into the junction with the suspended channels 50. The n-type and/or p-type dopant that is being driven from the n-type or p-type doped glass 30 that is present in the divot region 25 to the suspended channels 50 typically provides a sharp source/drain junction 51. By "sharp" it is meant that the n-type or p-type dopant of the junction, which diffused from the n-type or p-type glass 30 that is present in the divot region 25, abruptly decreases in dopant concentration to a low level, e.g., $1 \times 10^{15}$ dopants/cm$^3$ to $1 \times 10^{17}$ dopants/cm$^3$, beyond the interface of the doped glass layer 30 and the replacement gate structure 55. The sharp junctions 51 may extend from the inner edge E1 of the cladding spacer 20 (and the inner edge of the doped glass layer 30) towards the center of the channel at an abrupt dopant concentration gradient of n-type or p-type dopants of 5 nm per decade or less, e.g., 3-5 nm per decade or less. In one embodiment, the sharp junctions 51 may extend from the inner edge E1 of the cladding spacer 20 (and the inner edge of the doped glass layer 30) towards the center of the channel at an abrupt dopant concentration gradient of n-type or p-type dopants of 5 nm per decade or less, e.g., 2-5 nm per decade or less.

In one embodiment, the drive in anneal includes an annealing process selected from the group consisting of rapid thermal annealing (RTA), flash lamp annealing, furnace annealing, laser annealing and combinations thereof. In one embodiment, the drive in anneal may include a temperature ranging from 550° C. to 1100° C. In another embodiment, the drive in anneal may include a temperature ranging from 800° C. to 1200° C., and a time period ranging from 10 milliseconds to 100 seconds.

FIG. 8B is a cross-sectional view through the spacer illustrating the portions of the suspended channel 50 underlying the cladding spacer being doped with the n-type or p-type dopant that has been driven from the n-type or p-type doped glass by the drive in anneal.

Figure 9:
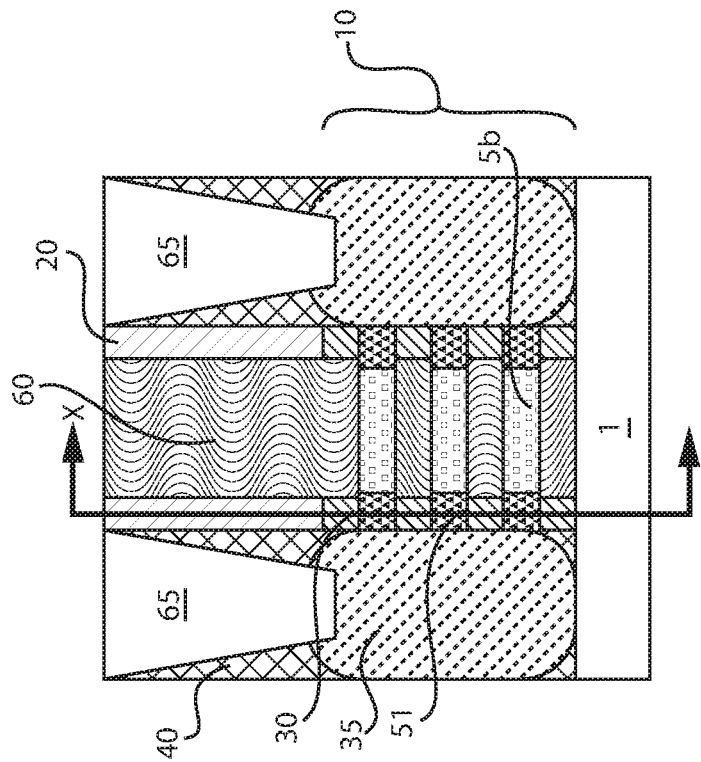
FIG. 9 is a side cross-sectional view of the fin structure stack along the source to drain direction depicting substituting the second replacement gate structure with a functional gate structure, in accordance with one embodiment of the present disclosure.

FIG. 9 depicts one embodiment of removing the second replacement gate structure 55; and forming a functional gate structure 60. The second replacement gate structure 55 that is depicted in FIG. 8 is similar to the first replacement gate structure that is described in FIGS. 1-7. Therefore, the description of removing the first replacement gate structure 15 is suitable for describing one embodiment of removing a second replacement gate structure 55.

FIG. 9 depicts forming a functional gate structure 60 in the gate opening that is formed by removing the second replacement gate structure 55. The functional gate structure 60 operates to switch the semiconductor device from an "on" to "off" state, and vice versa. The functional gate structure 60 may be formed by first depositing at least one gate dielectric on the suspended channel structures 50, e.g., nanowires or nanosheets, of the semiconductor device followed by filling the void with at least one gate conductor that is deposited on the at least one gate dielectric. The gate dielectric can be formed on the entirety of the exterior surface of the suspended channel structures 50.

The at least gate dielectric may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The at least one gate dielectric can be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation.

The at least one gate conductor that is formed on the at least one gate dielectric may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The at least one gate conductor can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. In some embodiments, the at least one gate conductor may include a doped semiconductor material, e.g., n-type or p-type doped semiconductor material. For example, the at least one gate conductor may be composed of polysilicon, which can be doped within an appropriate impurity by utilizing either an in-situ doping deposition process or by utilizing deposition, followed by a step, such as ion implantation or gas phase doping, in which the appropriate impurity is introduced into the polysilicon.

Figure 10:
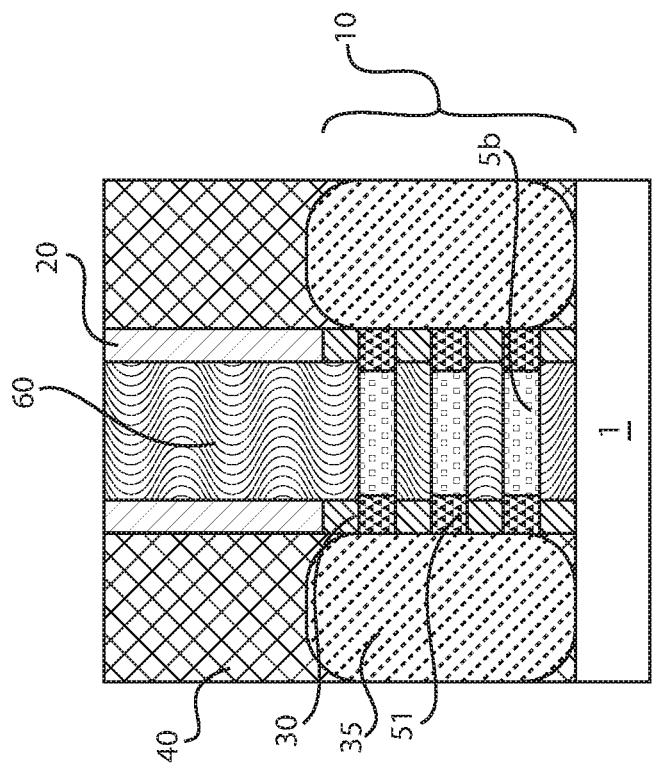
FIG. 10 is a side cross-sectional view of the fin structure stack along the source to drain direction depicting one embodiment of forming contacts to the source and drain regions of the device.

FIG. 10 depicts one embodiment of forming contacts 65 to the source and drain regions of the device. Forming contacts 65 may begin with forming a via opening in the interlevel dielectric layer 40, and filling the via opening with an electrically conductive material. In some embodiments, the via opening may be formed using pattern and etch processing. The electrically conductive material may be a metal, such as tungsten, titanium, aluminum, copper or a combination thereof, which may be deposited using a method, such as physical vapor deposition, e.g., plating and/or sputtering.

FIG. 10 depicts one embodiment of a semiconductor device that may include a functional gate structure 60 present on at least two suspended channel structures 50. A composite spacer 20, 30 present on sidewalls of the gate structure 60, the composite spacer comprising a cladding spacer 20 present along a cap portion of the gate structure 60; and an inner spacer 30 along the channel portion of the gate structure between adjacent channel semiconductor layers of said at least two suspended channel structures, the inner spacer comprising an n-type or p-type doped glass 30. The at least two suspended channel structures 50 may be composed of nanowires, nanosheets or a combination thereof. The semiconductor device may include source and drain regions comprising an epitaxial material 35 abutting an outer sidewall of the composite spacer. The p-type doped glass that is present in the divot region may be composed of boron doped silicate glass or phosphorus doped silicate glass. The semiconductor device may further include junctions 51 provided by dopant diffused from the n-type or p-type doped glass 30 into the suspended channels. The junctions may be referred to as sharp junctions. The sharp junctions 51 may extend from the inner edge E1 of the cladding spacer 20 towards the center of the channel at an abrupt dopant concentration gradient of n-type or p-type dopants of 5 nm per decade or less, e.g., 3-5 nm per decade or less. In one embodiment, the sharp junctions 51 may extend from the inner edge E1 of the cladding spacer 20 (and the inner edge of the inner spacer 30) towards the center of the channel at an abrupt dopant concentration gradient of n-type or p-type dopants of 5 nm per decade or less, e.g., 2-5 nm per decade or less.

The methods and structures that have been described above with reference to FIGS. 1-10 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device comprising:
    forming a gate structure on a stack of at least two semiconductor materials, wherein a spacer is present on sidewalls of the gate structure;
    etching exposed portions of the stack of at least two semiconductor materials with an etch process, wherein the etch process includes a stage that removes one of the at least two semiconductor materials at a faster rate than a second of the at least two semiconductor materials to provide a divot region undercutting the spacer;
    forming an n-type or p-type doped glass that fills the divot region;
    forming doped epitaxial semiconductor material on remaining semiconductor material from the stack of at least two semiconductor materials; and
    driving dopants from the doped glass into a mid-portion of a channel through direct contact with the second of the at least two semiconductor materials to permit dopants to pass laterally toward the mid-portion of the channel beyond the doped glass, after forming the doped epitaxial semiconductor material, by applying a drive in anneal that forms a sharp junction between a doped portion and an undoped portion of the second of the at least two semiconductor materials in the mid-portion of the channel beyond the doped glass.

2. The method of claim 1, wherein the etch process removes one the at least two semiconductor materials so that the remaining semiconductor material provides suspended source and drain semiconductor material layers.

3. The method of claim 2, wherein the epitaxial semiconductor material is formed on the suspended source and drain semiconductor material layers.

4. The method of claim 1, wherein the etching of the exposed portions of the stack of at least two semiconductor materials removes the entirety of the stack of the at least two semiconductor materials that extends beyond an outer sidewall of the spacer.

5. The method of claim 4, wherein said forming epitaxial semiconductor material on remaining semiconductor material from said stack of said at least two semiconductor materials comprises forming the epitaxial semiconductor material on an etched sidewall of the stack that is substantially aligned with the outer sidewall of the spacer.

6. The method of claim 1, wherein said forming the gate structure comprises:
    forming a replacement gate structure on the stack of said at least two semiconductor materials prior to forming the n-type or p-type doped glass;
    removing the replacement gate structure after said forming said epitaxial semiconductor material;
    removing one of the two semiconductor materials of the stack in a channel region of the device;
    converting a remaining semiconductor material of the stack in channel region to at least one of a nano-sheet or a nanowire geometry; and
    forming a functional gate structure in an opening produced by said removing the replacement gate structure.

7. The method of claim 6 further comprising applying an etch process after said forming the n-type or p-type doped glass to provide the exposed sidewalls of the remaining semiconductor material of the stack of two semiconductor materials.

8. The semiconductor device of claim 6, wherein the p-type doped glass comprises boron doped silicate glass.

9. The semiconductor device of claim 6, wherein the n-type doped glass comprises phosphorus doped silicate glass.

10. A method of forming a semiconductor device comprising:
  forming a replacement gate structure on a channel portion of a stack of at least two semiconductor materials;
  forming a cladding spacer on sidewalls of the replacement gate structure;
  applying a first etch process to remove one of the at least two semiconductor materials to provide divot regions undercutting the cladding spacer;
  forming an n-type or p-type doped glass layer filling the divot regions in the stack of at least two semiconductor materials that are undercutting the cladding spacer;
  removing the replacement gate structure to provide a gate opening that exposes a channel portion of the stack of the two semiconductor materials;
  driving dopants from the doped glass into a mid-portion of a channel through direct contact with the second of the at least two semiconductor materials to permit dopants to pass laterally toward the mid-portion of the channel beyond the doped glass by applying a drive in anneal that forms a sharp junction between a doped portion and an undoped portion of the second of the at least two semiconductor materials in the mid-portion of the channel beyond the doped glass in the channel portion of the stack;
  applying a second etch process to remove one of the at least two semiconductor materials in the center of the channel portion of the at least two semiconductor materials to provide a plurality of suspended channels; and
  forming a functional gate structure in the channel opening.

11. The method of claim 10, further comprising forming epitaxial semiconductor material on source and drain portions of the stack of the at least two semiconductor materials.

12. The method of claim 11, wherein said applying the second etch process to remove one of the at least two semiconductor materials in the center of the channel portion comprises:
  removing one of the two semiconductor materials of the stack in a channel portion of the device; and
  converting a remaining semiconductor material of the stack in channel portion to at least one of a nano-sheet or a nanowire geometry.

13. The method of claim 10, wherein said forming the n-type or p-type doped glass layer comprises forming boron silicate glass.

14. The method of claim 10, wherein said forming the n-type or p-type doped glass layer comprises forming phosphorus silicate glass.

15. The method of claim 10, wherein the functional gate structure comprises a gate dielectric and a gate conductor.

16. The method of claim 1, wherein a dopant concentration gradient closer to the center of the stack than the sharp junction is less than or equal to 5 nm per decade.

17. The method of claim 10, wherein a dopant concentration gradient closer to the center of the stack than the sharp junction is less than or equal to 5 nm per decade.

* * * * *